(12) United States Patent
Sanada

(10) Patent No.: US 12,389,571 B2
(45) Date of Patent: Aug. 12, 2025

(54) COOLING DEVICE FOR ELECTRONIC EQUIPMENT

(71) Applicant: TOSHIBA TEC KABUSHIKI KAISHA, Tokyo (JP)

(72) Inventor: Tsuyoshi Sanada, Susono Shizuoka (JP)

(73) Assignee: TOSHIBA TEC KABUSHIKI KAISHA, Tokyo (JP)

( * ) Notice: Subject to any disclaimer, the term of this patent is extended or adjusted under 35 U.S.C. 154(b) by 220 days.

(21) Appl. No.: 18/361,945

(22) Filed: Jul. 31, 2023

(65) Prior Publication Data

US 2024/0155812 A1    May 9, 2024

(30) Foreign Application Priority Data

Nov. 8, 2022    (JP) .................................. 2022-178570

(51) Int. Cl.
*H05K 7/20* (2006.01)

(52) U.S. Cl.
CPC ..... *H05K 7/20409* (2013.01); *H05K 7/20145* (2013.01); *H05K 7/20172* (2013.01)

(58) Field of Classification Search
CPC ............... H01L 23/467; H01L 23/3672; H01L 23/4093; G06F 1/20; G06F 2200/201; H05K 7/20145; H05K 7/20154; H05K 7/20172; H05K 7/20409; B60H 1/345
USPC .......................... 361/697, 719, 720, 703, 695
See application file for complete search history.

(56) References Cited

U.S. PATENT DOCUMENTS

| | | | | |
|---|---|---|---|---|
| 2007/0058341 A1* | 3/2007 | Hsiao | ..................... | H01L 23/467 |
| | | | | 257/E23.099 |
| 2007/0091566 A1* | 4/2007 | Sun | ........................... | G06F 1/20 |
| | | | | 361/695 |
| 2007/0121301 A1* | 5/2007 | Tan | ..................... | H01L 23/4093 |
| | | | | 257/E23.099 |
| 2007/0256433 A1* | 11/2007 | Bhatti | ..................... | F24F 1/035 |
| | | | | 62/304 |
| 2007/0274038 A1* | 11/2007 | Sun | ........................... | G06F 1/20 |
| | | | | 257/E23.099 |

(Continued)

FOREIGN PATENT DOCUMENTS

JP    2003-283171    10/2003

OTHER PUBLICATIONS

Extended European Search Report for European Patent Application No. 23196182.2 dated Jun. 28, 2024.

*Primary Examiner* — Mandeep S Buttar
(74) *Attorney, Agent, or Firm* — Amin, Turocy & Watson, LLP

(57) ABSTRACT

A fan duct includes: an intake port to introduce air by a fan; a heat sink to dissipate heat by allowing air introduced from the intake port to pass between a plurality of fins; a branch wall disposed downstream in a flow of air, to branch the flow of air passing between the fins into two directions; and a plurality of ribs each being a plate-like member directed toward the fins in a manner of being parallel to the fins at a side where a branch angle exceeds 45°, and comprising an apex portion at a tip end thereof, the rib being configured to, at the tip end, branch the flow of air passing between the fins into two directions, a base of the ribs being connected to the branch wall; and an exhaust port to exhaust the air branched by the ribs and the branch wall.

20 Claims, 6 Drawing Sheets

(56) References Cited

U.S. PATENT DOCUMENTS

| | | | |
|---|---|---|---|
| 2008/0062641 A1* | 3/2008 | Lai | H01L 23/467 |
| | | | 257/E23.099 |
| 2008/0101018 A1* | 5/2008 | Long | H01L 23/467 |
| | | | 257/E23.099 |
| 2010/0302730 A1* | 12/2010 | Hernon | H05K 7/20145 |
| | | | 165/185 |
| 2017/0083058 A1* | 3/2017 | Janak | G06F 1/20 |
| 2024/0049420 A1* | 2/2024 | Sanada | H05K 7/20145 |
| 2024/0155805 A1* | 5/2024 | Sanada | H05K 7/20154 |
| 2024/0155813 A1* | 5/2024 | Sanada | H05K 7/20172 |

\* cited by examiner

COOLING DEVICE FOR ELECTRONIC EQUIPMENT

CROSS-REFERENCE TO RELATED APPLICATION

This application is based upon and claims the benefit of priority from Japanese Patent Application No. 2022-178570, filed on Nov. 8, 2022, the entire contents of which are incorporated herein by reference.

FIELD

Embodiments described herein relate generally to a cooling device for electronic equipment.

BACKGROUND

In the related art, electronic equipment such as a personal computer (PC) includes a component whose temperature increases to a high temperature, such as a central processing unit (CPU). A heat sink is generally attached to such a component for heat dissipation. The air suctioned by a fan disposed upstream flows to the heat sink and is exhausted downstream of the heat sink, whereby heat is dissipated.

Recently, to meet requirements for miniaturization of electronic equipment, components such as input and output equipment of a CPU and a connector may be disposed downstream of a heat sink in a housing of electronic equipment. Such a component is not preferable because a smooth flow of air passing through the heat sink is hindered and the heat dissipation performance is deteriorated.

DETAILED DESCRIPTION

In general, according to one embodiment, a cooling device for electronic equipment that can obtain good heat dissipation performance even when an obstacle is present leeward of a heat sink is provided.

Solution to Problem

A cooling device for electronic equipment according to one embodiment includes an intake port, a heat sink, a branch wall, a plurality of ribs, and an exhaust port. The intake port is provided with a fan and introduces air. The heat sink dissipates heat generated from electronic equipment by allowing air introduced from the intake port to pass between a plurality of fins. The branch wall is disposed downstream in a flow of the air across the plurality of fins of the heat sink in a manner of being orthogonal to a longitudinal direction of the fin, and is configured to branch a flow of air passing between the fins into two directions, one of which has a branch angle of 45° or less with respect to an exhaust direction of air passing between the fins. The plurality of ribs are each a plate-like member directed toward the fins in a manner of being parallel to the fins at a side of the branch wall where a branch angle exceeds 45°, and including an apex portion at a tip end thereof. The rib branches, at the tip end, a flow of air passing between the fins into two directions. A base of the rib is connected to the branch wall. The exhaust port discharges air branched by the rib and the branch wall.

An embodiment in which a cooling device of the present disclosure is applied as a fan duct 1 will be described with reference to the drawings.

Schematic Structure of Fan Duct

Figure 1:
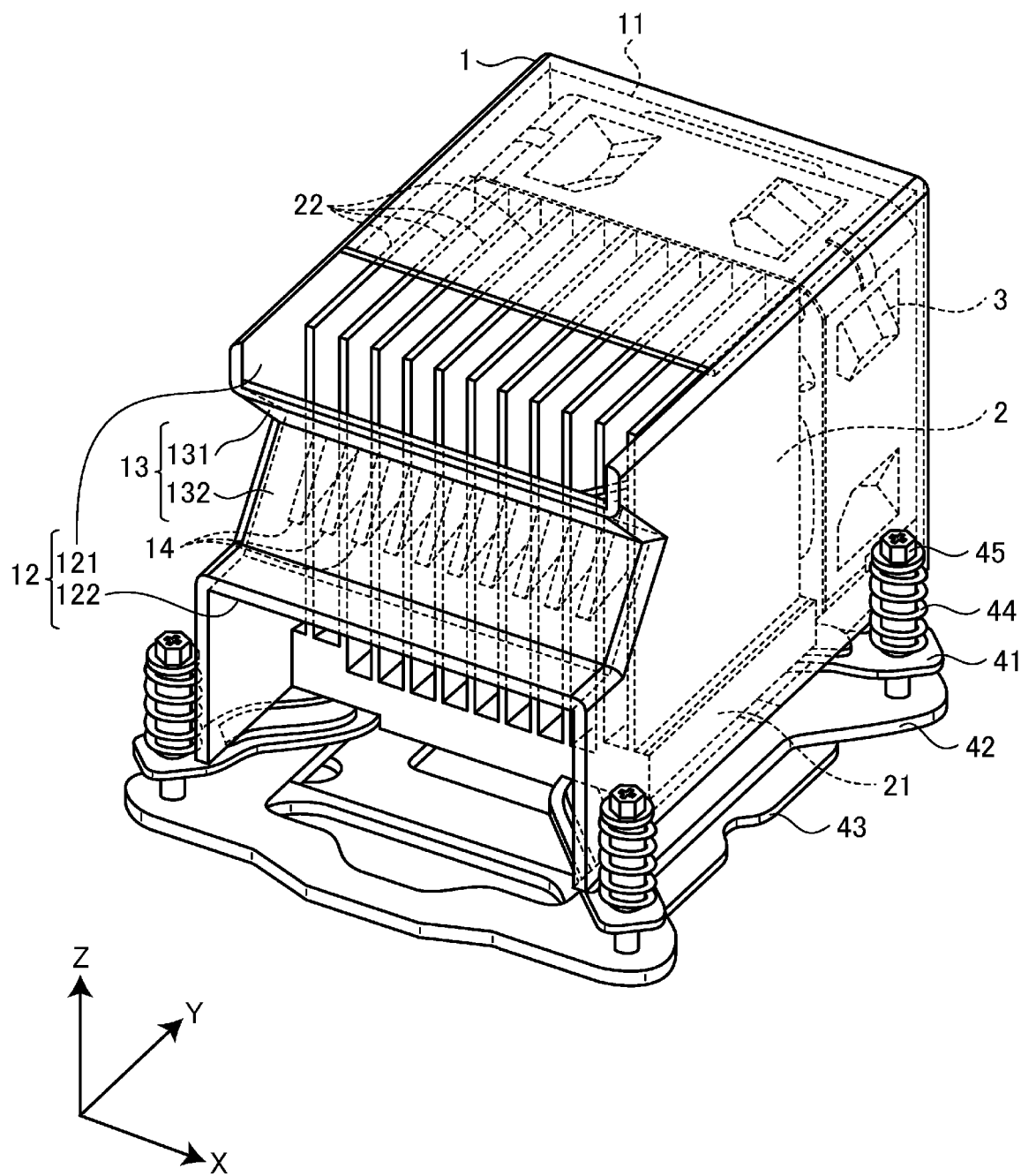
FIG. 1 is a perspective view illustrating an example of a fan duct.

A schematic structure of the fan duct 1 as an example of a cooling device of the present disclosure will be described with reference to FIG. 1. FIG. 1 is a perspective view illustrating the example of the fan duct according to the embodiment. For convenience of description, a three-dimensional coordinate system XYZ shown in FIG. 1 is set. In the three-dimensional coordinate system XYZ, a width direction (left-right direction) of the fan duct 1 is defined as an X-axis direction, a depth direction (front-rear direction) is defined as a Y-axis direction, and a height direction (up-down direction) is defined as a Z-axis direction.

As illustrated in FIG. 1, the fan duct 1 is a cover member that has a substantially box shape and that covers a heat sink 2 and a suction fan 3 for blowing air to the heat sink 2. The fan duct 1 is a member having so-called intake duct and exhaust duct, in which air suctioned by the suction fan 3 from an intake port 11 passes between fins 22 of the heat sink 2 installed inside a ventilation pipe (duct) and is exhausted from an exhaust port 12.

The suction fan 3 suctions air outside the fan duct 1, introduces the suctioned air into the fan duct 1, and blows the air in a −Y-axis negative direction. The suction fan 3 is an example of a fan disclosed herein. In the fan duct 1, the intake port 11 is provided at a position upstream in an air blowing direction of the suction fan 3, and the exhaust port 12 is provided at a position downstream.

Hereinafter, the simple term "upstream" means upstream (or windward) in the air blowing direction of the suction fan 3. Similarly, the simple term "downstream" means downstream (or leeward) in the air blowing direction of the suction fan 3.

The heat sink 2 is attached to an electronic component that generates heat, for example, a central processing unit (CPU). The heat generated by the CPU is conducted through the heat sink 2. The heat transferred through the heat sink 2 is dissipated to the surrounding air. Accordingly, malfunction or the like due to overheating of the CPU is prevented.

The heat sink 2 includes a base portion 21 and a plurality of fins 22. The fin 22 is erected on the base portion 21. The plurality of fins 22 are adjacent to each other at a predetermined interval. The base portion 21 is in contact with the CPU, and the heat of the CPU is conducted thereto. The fins 22 dissipate the heat conducted from the base portion 21 into the air.

The heat sink 2 is fixed on frames 41, 42, and 43, which are layered at predetermined intervals, with coiled springs 44 and screws 45. A motherboard 101 (see FIG. 2) is sandwiched between the frame 41 and the frame 42.

For example, blades rotated by an electric motor continuously blows air in one direction, whereby the suction fan 3 blows air. In the embodiment, the intake port 11, the suction fan 3, the heat sink 2, and the exhaust port 12 are arranged in this order from the upstream side to the downstream side in the air blowing direction of the suction fan 3.

In order to sufficiently exhibit the effect of the fan duct 1 described above, it is desirable that no component (obstacle) that hinders exhaust is provided leeward of the exhaust port 12. However, due to a size of electronic equipment 100 (see FIG. 2) including the fan duct 1, arrangement of built-in components, and the like, an obstacle may be arranged downstream of the exhaust port 12.

In order to exhaust air while avoiding such obstacles on the leeward side, the fan duct 1 includes a branch wall 13 and a plurality of ribs 14 illustrated in FIG. 1. The branch wall 13 branches a flow of air passing between the fins 22 of the heat sink 2 into two directions. The ribs 14 are disposed on a wall surface of the branch wall 13, in parallel to the fins 22 of the heat sink 2, and branch the flow of air passing between the fins 22 of the heat sink 2 into two directions. The branch wall 13 and the ribs 14 will be described in detail later (see FIGS. 4 and 5).

Schematic Structure of Electronic Equipment

Figure 2:
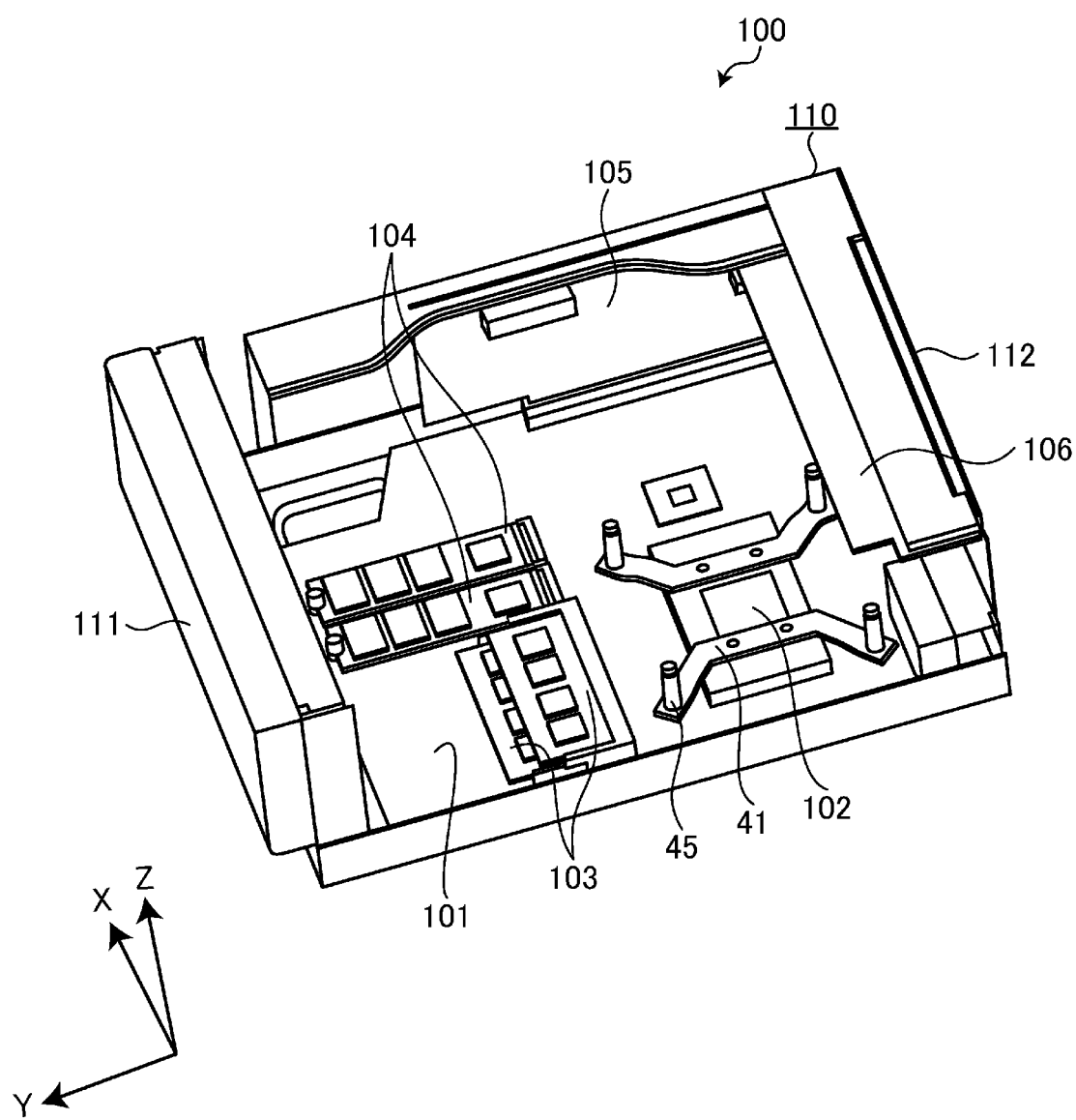
FIG. 2 is a perspective view illustrating an example of a schematic structure of electronic equipment to which the fan duct is attached.
Figure 3:
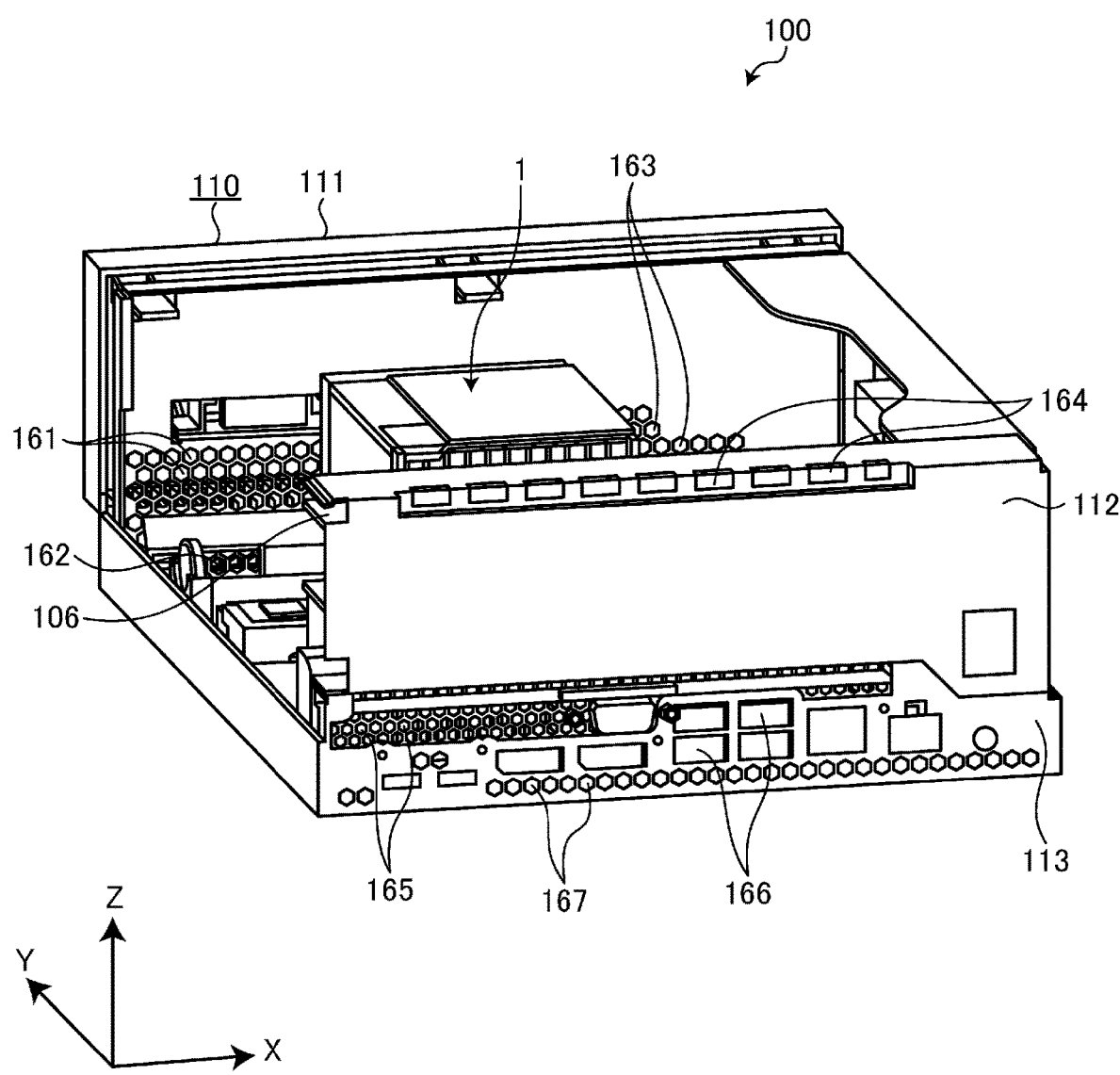
FIG. 3 is a perspective view illustrating an example of a vent hole provided in an electronic equipment.

Electronic equipment attached with a fan duct will be described with reference to FIGS. 2 and 3. FIG. 2 is a perspective view illustrating an example of a schematic structure of the electronic equipment attached with the fan duct. FIG. 3 is a perspective view illustrating an example of a vent hole provided in the electronic equipment.

As illustrated in FIG. 2, the electronic equipment 100 includes the motherboard 101, a CPU 102, a memory 103, a solid state drive (SSD) 104, a riser card 105, and an input and output board 106 inside a housing 110.

The motherboard 101 is an example of a circuit board mounted with an electronic component (the CPU 102 in the embodiment) that dissipates heat through the heat sink 2. The memory 103 and the SSD 104 also generate heat due to operations thereof. The heat is also dissipated by a flow of air in the housing 110 that is generated by the air blown by the suction fan 3.

The input and output board 106 is connected to the motherboard 101 via an insertion port (slot) of the riser card 105. Since the input and output board 106 is arranged in parallel to the motherboard 101 by being connected to the insertion port of the riser card 105, it is possible to reduce a height dimension of the housing 110.

However, when the input and output board 106 is located downstream of the exhaust port 12 due to the above-described arrangement, the input and output board 106 becomes an obstacle that hinders the exhaust. In the embodiment, the exhaust from the fan duct 1 avoids the input and output board 106.

As illustrated in FIG. 3, the fan duct 1 is accommodated inside the housing 110 of the electronic equipment 100. Vent holes 161, 162, and 163 for taking in air to be introduced into the fan duct 1 and vent holes 164, 165, 166, and 167 for exhausting air passing through the fan duct 1 are provided in the housing 110.

The vent holes 161, 162, and 163 are provided in a front cover 111 that constitutes a front face of the housing 110. The vent holes 164 and 165 are provided in a rear cover 112 that constitutes a rear face of the housing 110. The vent holes 166 and 167 are provided in an input and output panel 113 that constitutes a part of the rear face of the housing 110. The input and output panel 113 includes connection terminals of various types of peripheral equipment for connecting to the electronic equipment 100.

In the electronic equipment 100 of the embodiment, the input and output board 106 is arranged behind the CPU 102. Therefore, the exhaust port 12 of the fan duct 1 is divided into an upper exhaust port 121 that opens toward upward and a lower exhaust port 122 that opens toward downward, so that the exhaust avoids the input and output board 106 (see FIG. 1). Specifically, the exhaust port 12 is divided into the upper exhaust port 121 and the lower exhaust port 122 by the branch wall 13 and the ribs 14 illustrated in FIG. 1. The ribs 14 are erected from the branch wall 13 toward the heat sink 2. Further, a plurality of the ribs 14 are provided along the X axis (side by side in the left-right direction) at fixed intervals. Details will be described later (see FIGS. 4 and 5).

Structures of Branch Wall and Rib

Figure 4:
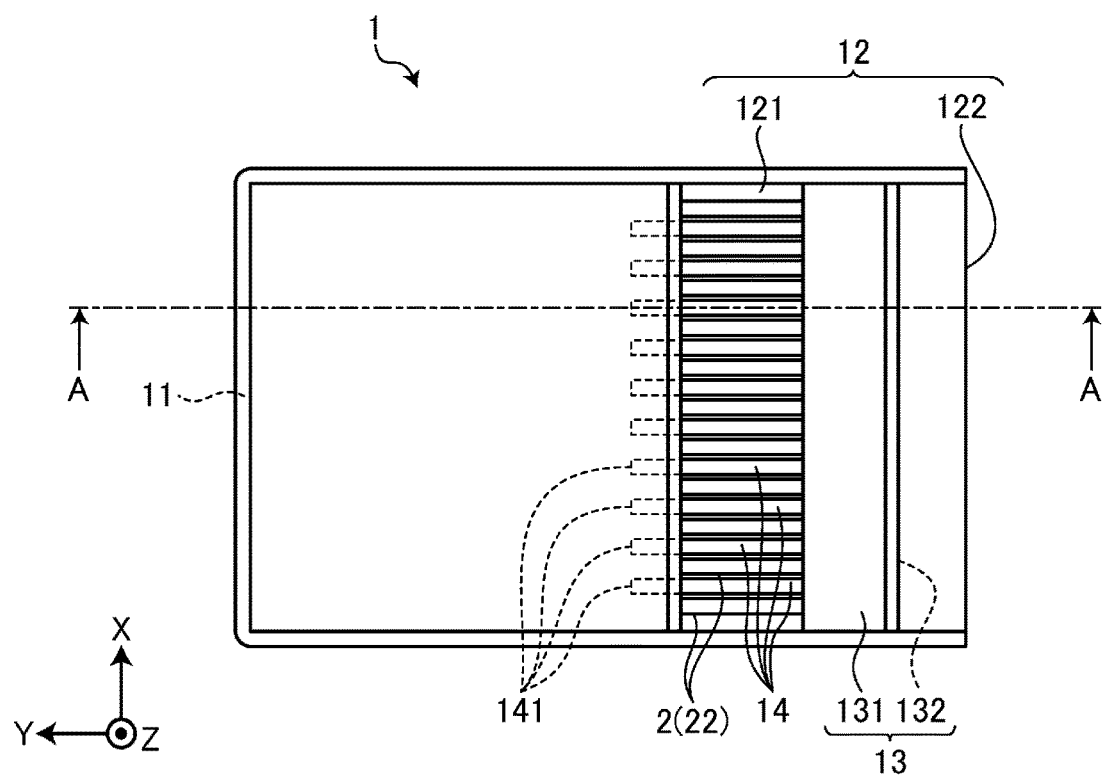
FIG. 4 is a plan view illustrating an example of a shape of the fan duct.
Figure 5:
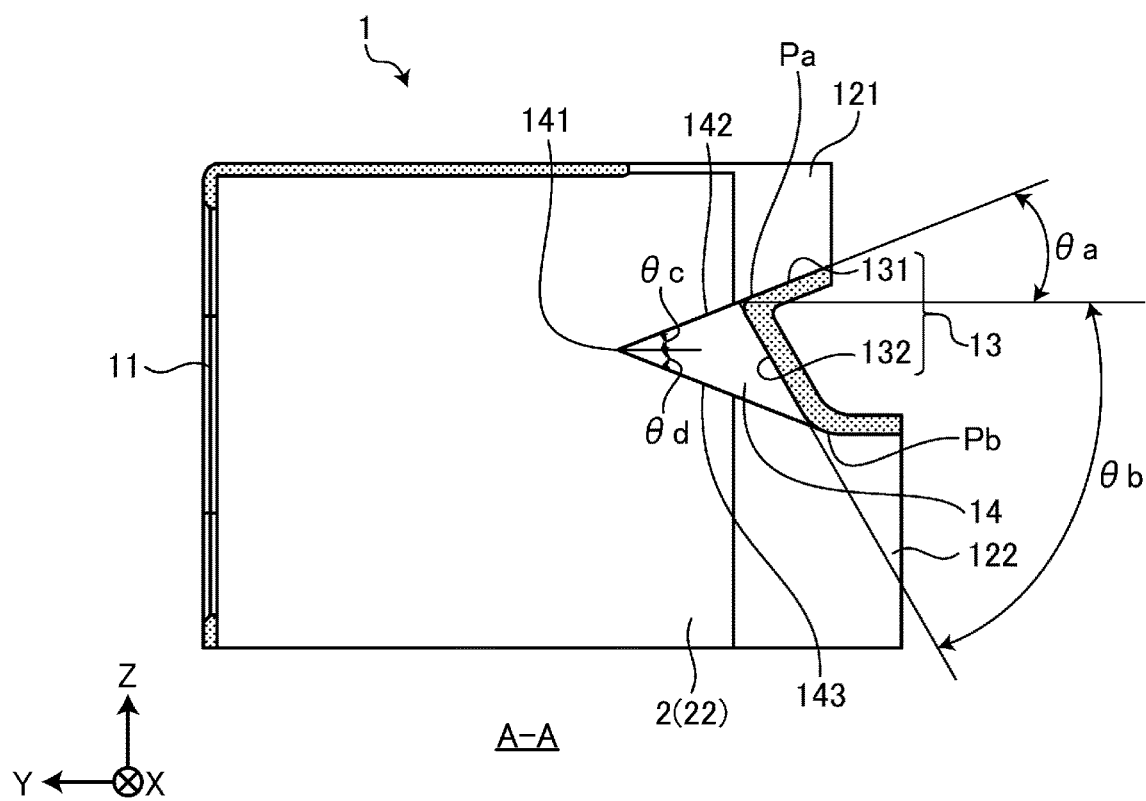
FIG. 5 is a longitudinal side view illustrating the example of the shape of the fan duct.

Structures of the branch wall 13 and the ribs 14 will be described with reference to FIGS. 4 and 5. FIG. 4 is a plan view illustrating an example of a shape of the fan duct. FIG. 5 is a longitudinal sectional view illustrating the example of the shape of the fan duct.

The branch wall 13 is disposed at an inner side of an edge of the exhaust port 12, and has a substantially V-shaped cross section in a side view as illustrated in FIG. 5, and a bent portion thereof protrudes toward the heat sink 2. The flow of air passing between the fins 22 of the heat sink 2 is divided into two by the branch wall 13.

The branch wall 13 is disposed downstream in the flow of air across the plurality of fins 22 of the heat sink 2 in a manner of being orthogonal to a longitudinal direction of the fins 22. The branch wall 13 includes an upper wall portion 131 and a lower wall portion 132. The upper wall portion 131 and the lower wall portion 132 are connected at sides along the X axis upstream in the air blowing direction of the suction fan 3. The upper wall portion 131 and the lower wall portion 132 are inclined with respect to the air blowing direction of the suction fan 3 such that a distance therebetween increases downstream in the air blowing direction of the suction fan 3. The upper wall portion 131 guides the flow of air, which passes between the fins 22 of the heat sink 2, in an obliquely upward direction. The lower wall portion 132 guides the flow of air, which passes between the fins 22 of the heat sink 2, in an obliquely downward direction. In this way, the branch wall 13 guides the exhaust so as to avoid a partial range downstream of the branch wall 13 (a range where the input and output board 106 is disposed (see FIG. 6)), and branches the exhaust.

The branch wall 13 divides the exhaust port 12 into the upper exhaust port 121 and the lower exhaust port 122. The upper exhaust port 121 discharges the exhaust, which flows along the upper wall portion 131, from the vent hole 164 (see FIG. 3) to the outside of the housing 110. The lower exhaust port 122 discharges the exhaust, which flows along the lower wall portion 132, from the vent holes 165, 166, and 167 (see FIG. 3) to the outside of the housing 110. As illustrated in FIG. 5, the branch wall 13 has a substantially V-shaped cross section in a side view, and the bent portion thereof protrudes toward the heat sink 2. The flow of air passing between the fins 22 of the heat sink 2 is divided into two by the branch wall 13.

A deflection angle $\theta a$ between the upper wall portion 131 of the branch wall 13 and an exhaust direction of the air passing through the fins 22 of the heat sink 2 (−Y-axis negative direction) is formed to be 45° or less. Further, a deflection angle $\theta b$ between the lower wall portion 132 of the branch wall 13 and the exhaust direction of the air passing through the fins 22 of the heat sink 2 (−Y-axis negative direction) is formed to exceed 45°.

The lower wall portion 132 of the branch wall 13 is provided with the plurality of ribs 14 that are directed toward the fin 22 of the heat sink 2 and that are parallel to the fin 22. The rib 14 is formed of, for example, a resin material, and is a plate-like member including a pointed apex portion 141 at a tip end thereof. A base of the rib 14 is connected to the lower wall portion 132 at a rib upper rear end Pa and a rib lower rear end Pb. In FIG. 4, the ribs 14 are inserted between the fins 22. Alternatively, the ribs 14 may not be inserted between the fins 22. When the ribs 14 are inserted between the fins 22, regions thereof inserted between the fins 22 may or may not contact the fins 22.

The branch wall 13 in FIG. 5 may be inverted in the up-down direction. In this case, the deflection angle θa of the upper wall portion 131 exceeds 45°, and the deflection angle θb of the lower wall portion 132 is 45° or less. The ribs 14 are disposed on the upper wall portion 131.

As illustrated in FIG. 5, a base of the rib 14 is smoothly connected to the branch wall 13. The rib 14 branches, at the apex portion 141 on the tip end, the flow of air passing between the fins 22 into a flow along an upper edge portion 142 and a flow along a lower edge portion 143 illustrated in FIG. 5. In FIG. 5, the upper edge portion 142 and the lower edge portion 143 of the rib 14, which extend from the apex portion 141 to the base, are both formed in a straight line. That is, a region of the rib 14 in a plate thickness direction (a region along the X-axis) is formed as a flat surface. The upper edge portion 142 and the lower edge portion 143 of the rib 14 may be formed in a curved line (see FIG. 8). That is, the region of the rib 14 in the plate thickness direction (the region along the X-axis) may be formed as a curved surface. One of the upper edge portion 142 and the lower edge portion 143 may be formed in a straight line, and the other may be formed in a curved line. Further, the upper edge portion 142 and the lower edge portion 143 may be partially formed in a straight line, and the remaining portions thereof may be formed in a curved line. That is, the region of the rib 14 in the plate thickness direction (the region along the X-axis) may be formed by a combination of a flat surface and a curved surface.

A deflection angle θc between the upper edge portion 142 of the rib 14 and the exhaust direction of the air passing between the fins 22 of the heat sink 2 (−Y-axis negative direction) is formed to be 30° or less. Further, a deflection angle θd between the lower edge portion 143 of the rib 14 and the exhaust direction of the air passing between the fins 22 of the heat sink 2 (−Y-axis negative direction) is formed to be 30° or less.

If the deflection angles θc and θd are too small, the apex portion 141 of the rib 14 becomes too sharp, and accordingly a filling failure of a raw material is likely to occur when forming a mold of the rib 14, which is not preferable. Further, if the deviations θc and θd are too small, a length of the rib 14 is increased to be longer than necessary in order to secure a sufficient distance between the upper edge portion 142 and the lower edge portion 143 at the base, and the rib 14 cannot fit in the exhaust port 12. Accordingly, it is desirable that the deflection angles θc and θd are as close to 30° as possible within a range not exceeding 30°.

The rib 14 is formed by, for example, pouring a resin material into a mold, but if a thickness of the rib 14 is 3 mm or less, sink marks are less likely to occur at the time of molding, and there is no need to perform thinning with the mold. Further, since there is no wall on the upper and lower sides of the rib 14, the rib 14 can be molded by a normal cavity core.

Positional Relationship Between Exhaust Port of Fan Duct and Mounted Components

Figure 6:
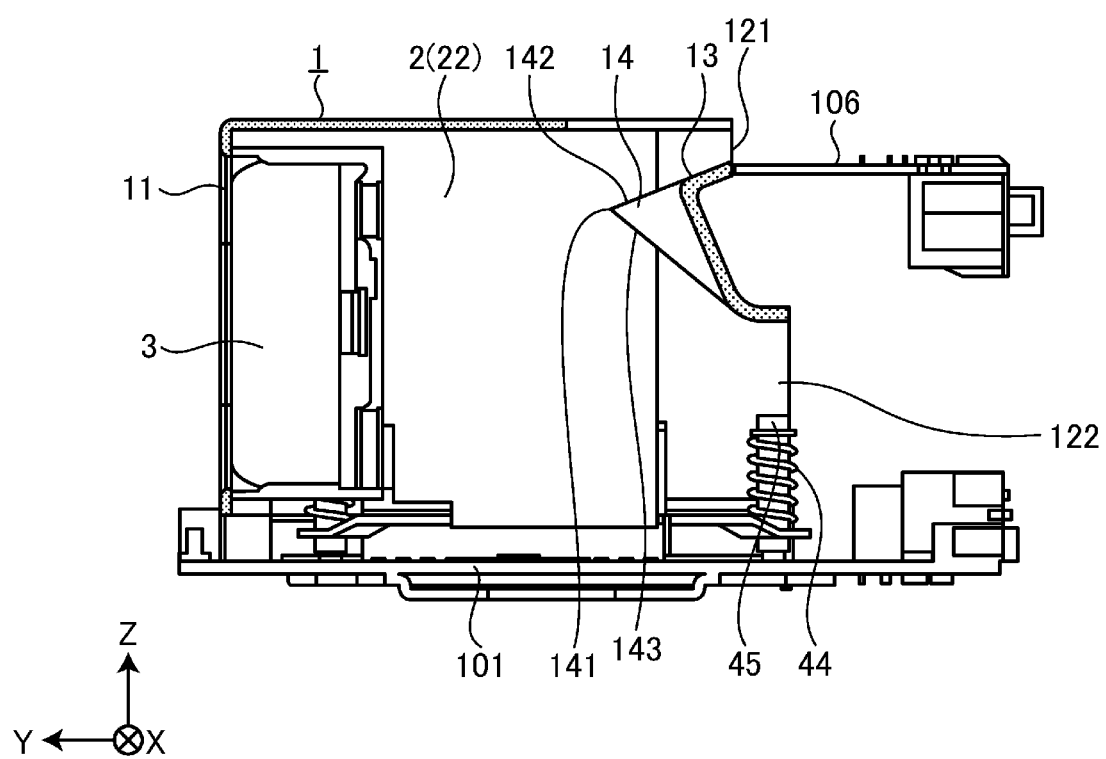
FIG. 6 is a longitudinal side view for illustrating a positional relationship between the fan duct and components near an exhaust port.

A positional relationship between the fan duct 1 of the embodiment and components mounted near the exhaust port will be described with reference to FIG. 6. FIG. 6 is a longitudinal sectional side view illustrating a positional relationship between the fan duct and components near the exhaust port.

As illustrated in FIG. 6, the input and output board 106 mounted near the exhaust port is disposed at a position not exposed to the exhaust from the upper exhaust port 121 and the exhaust from the lower exhaust port 122. Accordingly, the fan duct 1 enables components to be arranged downstream of the fan duct 1 without hindering the cooling performance for the CPU 102 in the electronic equipment 100 (see FIG. 2).

In such a configuration, when the electronic equipment 100 is energized, the CPU 102, the memory 103, the SSD 104, and the like generate heat, and temperatures thereof rise. When the suction fan 3 operates to blow air, the air flows inside the fan duct 1, and thus the CPU 102 for which the heat sink 2 is disposed is cooled. Further, at this time, among the exhaust from the upper exhaust port 121 and the lower exhaust port 122, air that is not discharged to the outside of the housing 110 (see FIG. 2) moves, for example, toward the intake port 11 inside the housing 110. Accordingly, since a flow of air is also generated outside the fan duct 1, the memory 103, the SSD 104, and the like for which the heat sink 2 is not disposed are also cooled by the flow of air.

Shape of Edge of Rib

Figure 7:
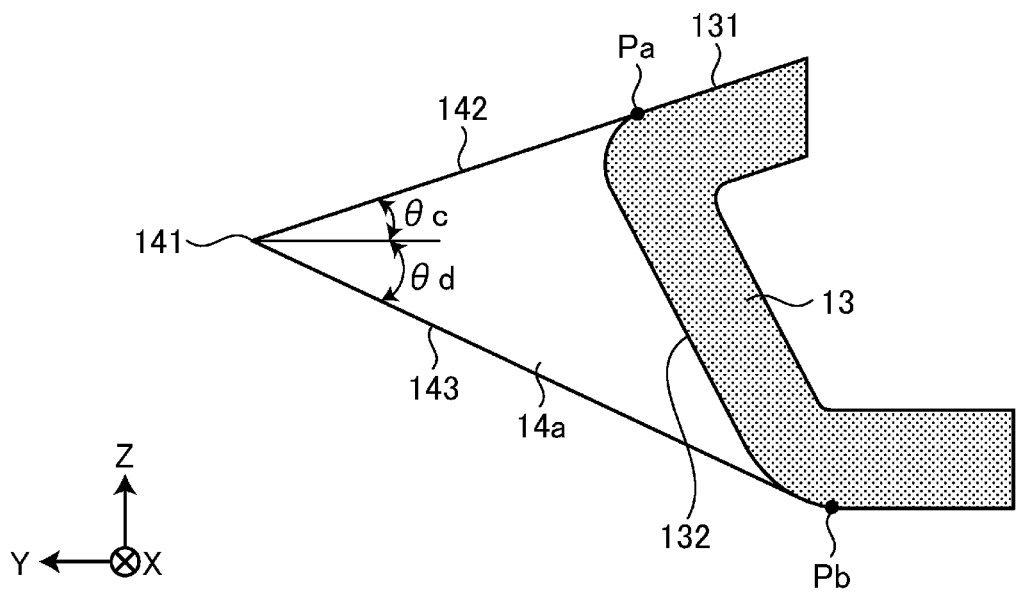
FIG. 7 is a first diagram illustrating an example of a shape of a rib.
Figure 8:
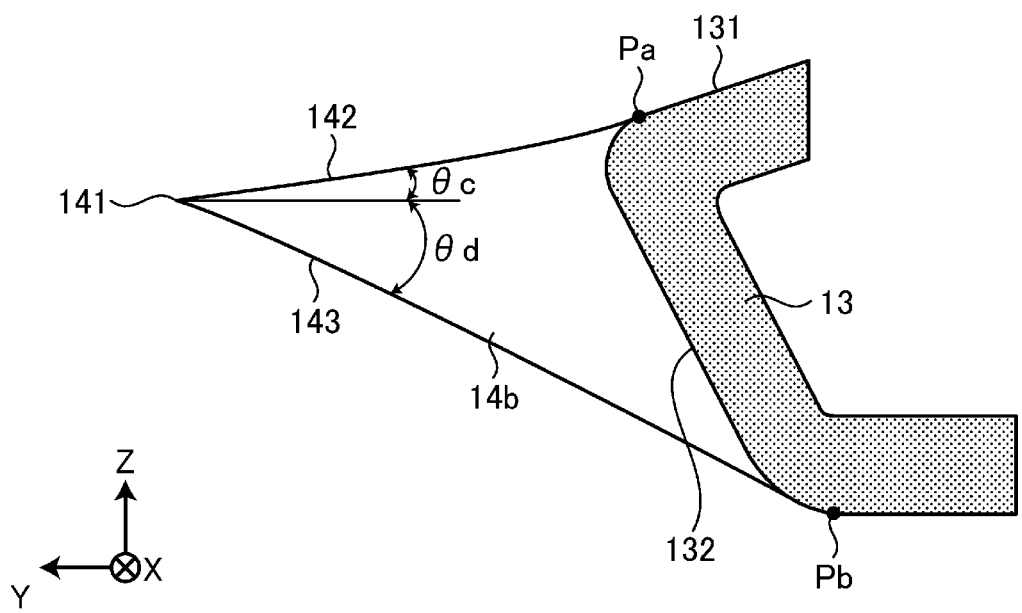
FIG. 8 is a second diagram illustrating an example of a shape of a rib.

Specific shapes of the upper edge portion 142 and the lower edge portion 143 of the rib 14 will be described with reference to FIGS. 7 and 8. FIG. 7 is a first diagram illustrating an example of a shape of the rib. FIG. 8 is a second diagram illustrating an example of the shape of the rib.

In a rib 14a illustrated in FIG. 7, the upper edge portion 142 and the lower edge portion 143 both have a linear shape. The upper edge portion 142 is connected to the upper wall portion 131 at the rib upper rear end Pa. The lower edge portion 143 is connected to the lower wall portion 132 at the rib lower rear end Pb.

At this time, a tangent of the upper edge portion 142 at the rib upper rear end Pa coincides with a tangent of the upper wall portion 131 at the rib upper rear end Pa. That is, the upper edge portion 142 and the upper wall portion 131 are smoothly connected at the rib upper rear end Pa. Further, a tangent of the lower edge portion 143 at the rib lower rear end Pb coincides with a tangent of the lower wall portion 132 at the rib lower rear end Pb. That is, the lower edge portion 143 and the lower wall portion 132 are smoothly connected at the rib lower rear end Pb.

In a rib 14b illustrated in FIG. 8, the upper edge portion 142 and the lower edge portion 143 both have a curved shape. The curve may be, for example, a quadratic curve such as an arc or a high-order curve. The upper edge portion 142 is connected to the upper wall portion 131 at the rib upper rear end Pa. The lower edge portion 143 is connected to the lower wall portion 132 at the rib lower rear end Pb.

At this time, a tangent of the upper edge portion 142 at the rib upper rear end Pa coincides with a tangent of the upper wall portion 131 at the rib upper rear end Pa. That is, the upper edge portion 142 and the upper wall portion 131 are smoothly connected at the rib upper rear end Pa. Further, a tangent of the lower edge portion 143 at the rib lower rear end Pb coincides with a tangent of the lower wall portion 132 at the rib lower rear end Pb. That is, the lower edge portion 143 and the lower wall portion 132 are smoothly connected at the rib lower rear end Pb.

Although a specific shape of a curve forming the upper edge portion 142 and the lower edge portion 143 of the rib 14b is not limited, the deflection angle θc of the upper edge portion 142 of the rib 14b gradually increases from the apex portion 141 to the rib upper rear end Pa, and is formed to be 30° or less from the apex portion 141 to the rib upper rear end Pa. The deflection angle θd of the lower edge portion 143 of the rib 14b gradually increases from the apex portion 141 to the rib lower rear end Pb, and is formed to be 30° or less from the apex portion 141 to the rib lower rear end Pb. The upper edge portion 142 and the lower edge portion 143 of the rib 14b may be formed in a combination of a curved line and a straight line.

Operations and Effects of Embodiment

As described above, the fan duct 1 (cooling device) according to the embodiment includes: the intake port 11 provided with the suction fan 3 (fan) and configured to introduce air; the heat sink 2 configured to dissipate heat generated from the electronic equipment 100 by allowing air introduced from the intake port 11 to pass between the plurality of fins 22; the branch wall 13 disposed downstream in the flow of air across the plurality of fins 22 of the heat sink 2 in a manner of being orthogonal to the longitudinal direction of the fin 22, and configured to branch the flow of air passing between the fins 22 into two directions, one of which has a branch angle of 45° or less with respect to the exhaust direction of the air passing through the fins 22; and the plurality of ribs 14 each being a plate-like member directed toward the fin 22 in a manner of being parallel to the fin 22 at a side of the branch wall 13 where a branch angle exceeds 45°, and including the apex portion 141 at the tip end thereof, the rib 14 being configured to branch, at the tip end, the flow of air passing between the fins 22 into two directions, the base of the ribs being connected to the branch wall 13; and the exhaust port 12 configured to exhaust the air branched by the ribs 14 and the branch wall 13. Accordingly, even when there is an obstacle leeward of the heat sink 2, good cooling performance can be obtained. In addition, a size of the heat sink 2 can be increased as much as possible in a limited space by inserting the rib 14 between the fins 22 of the heat sink 2, and thus both the miniaturization of the electronic equipment 100 and the improvement of the cooling performance can be achieved.

In the fan duct 1 (cooling device) according to the embodiment, both the upper edge portion 142 and the lower edge portion 143, which connect the apex portion 141 of the rib 14 and the base of the rib 14, are formed to have an angle of 30° or less from the apex portion 141 to the base with respect to a direction of flow of air passing between the fins 22 of the heat sink 2. Accordingly, the flow of air flowing between the fins 22 of the heat sink 2 can be branched at the apex portion 141 of the rib 14 to flow downstream without being disturbed.

In the fan duct 1 (cooling device) according to the embodiment, the tangents of each rib 14 and the tangents of the branch wall 13, at the connection points (the rib upper rear end Pa and the rib lower rear end Pb) between the base of the rib 14 and the branch wall 13, coincide with each other correspondingly in the side view of the rib 14. Accordingly, the air branched at the apex portion 141 of the rib 14 can smoothly flow from the upper edge portion 142 to the upper wall portion 131. The air branched at the apex portion 141 of the rib 14 can smoothly flow from the lower edge portion 143 to the lower wall portion 132. Accordingly, smooth exhaust can be performed.

In the fan duct 1 (cooling device) according to the embodiment, an interval between the upper edge portion 142 and the lower edge portion 143 of the rib 14 increases toward the base of the rib 14, and the upper edge portion 142 and the lower edge portion 143 are both formed in a straight line, a curved line, or a combination thereof in a side view of the rib 14. Accordingly, the air branched at the apex portion 141 of the rib 14 can smoothly flow downstream.

Other than in the operating examples, if any, or where otherwise indicated, all numbers, values and/or expressions referring to parameters, measurements, conditions, etc., used in the specification and claims are to be understood as modified in all instances by the term "about."

While certain embodiments have been described, these embodiments have been presented by way of example only, and are not intended to limit the scope of the embodiments. The novel embodiments can be implemented in various other forms, and various omissions, replacements, and modifications can be made without departing from the gist of the embodiments. The embodiments and modifications thereof are included in the scope and the gist of the embodiments, and are included in the disclosure described in the claims and the scope of equivalents of the disclosure.

What is claimed is:

1. A cooling device for electronic equipment, comprising:
   an intake port comprising a fan and configured to introduce air;
   a heat sink configured to dissipate heat generated from the electronic equipment by allowing air introduced from the intake port to pass between a plurality of fins;
   a branch wall disposed downstream in a flow of the air across the plurality of fins of the heat sink in a manner of being orthogonal to a longitudinal direction of the fins, and configured to branch a flow of air passing between the fins into two directions, one of which has a branch angle of 45° or less with respect to an exhaust direction of air passing between the fins;
   a plurality of ribs each being a plate-like member directed toward the fins in a manner of being parallel to the fins at a side of the branch wall where a branch angle exceeds 45°, and comprising an apex portion at a tip end thereof, the rib being configured to branch, at the tip end, a flow of air passing between the fins into two directions, a base of the ribs being connected to the branch wall; and
   an exhaust port configured to exhaust air branched by the rib and the branch wall.

2. The cooling device according to claim 1, wherein both an upper edge portion and a lower edge portion of the rib are formed to have an angle of 30° or less from the apex portion to the base with respect to a direction of flow of air passing between the fins of the heat sink.

3. The cooling device according to claim 2, wherein a tangent of each rib and a tangent of the branch wall, at a connection point between the base of the rib and the branch wall, coincide with each other in a side view of the rib.

4. The cooling device according to claim 3, wherein an interval between the upper edge portion and the lower edge portion of the rib increases toward the base of the rib, and both the upper edge portion and the lower edge portion are formed in a straight line, a curved line, or a combination thereof in a side view of the rib.

5. The cooling device according to claim 1, wherein the plurality of fins are adjacent to each other at a predetermined interval.

6. The cooling device according to claim 1, wherein the electronic equipment comprises at least one of a central processing unit, a motherboard, a memory, a solid state drive, a riser card, and an input and output board.

7. The cooling device according to claim 1, wherein the ribs are inserted between the fins.

8. A fan duct assembly to reduce a temperature of electronic equipment, comprising:
an intake port comprising a fan and configured to introduce air;
a heat sink configured to dissipate heat generated from the electronic equipment by allowing air introduced from the intake port to pass between a plurality of fins;
a branch wall disposed downstream in a flow of the air across the plurality of fins of the heat sink in a manner of being orthogonal to a longitudinal direction of the fins, and configured to branch a flow of air passing between the fins into two directions, one of which has a branch angle of 45° or less with respect to an exhaust direction of air passing between the fins;
a plurality of ribs each being a plate-like member directed toward the fins in a manner of being parallel to the fins at a side of the branch wall where a branch angle exceeds 45°, and comprising an apex portion at a tip end thereof, the rib being configured to branch, at the tip end, a flow of air passing between the fins into two directions, a base of the ribs being connected to the branch wall; and
an exhaust port configured to exhaust air branched by the rib and the branch wall.

9. The fan duct assembly according to claim 8, wherein both an upper edge portion and a lower edge portion of the rib are formed to have an angle of 30° or less from the apex portion to the base with respect to a direction of flow of air passing between the fins of the heat sink.

10. The fan duct assembly according to claim 9, wherein a tangent of each rib and a tangent of the branch wall, at a connection point between the base of the rib and the branch wall, coincide with each other in a side view of the rib.

11. The fan duct assembly according to claim 10, wherein an interval between the upper edge portion and the lower edge portion of the rib increases toward the base of the rib, and both the upper edge portion and the lower edge portion are formed in a straight line, a curved line, or a combination thereof in a side view of the rib.

12. The fan duct assembly according to claim 8, wherein the plurality of fins are adjacent to each other at a predetermined interval.

13. The fan duct assembly according to claim 8, wherein the electronic equipment comprises at least one of a central processing unit, a motherboard, a memory, a solid state drive, a riser card, and an input and output board.

14. The fan duct assembly according to claim 8, wherein the ribs are inserted between the fins.

15. A personal computer, comprising:
central processing unit; and
a cooling device, comprising:
an intake port comprising a fan and configured to introduce air;
a heat sink configured to dissipate heat generated from the central processing unit by allowing air introduced from the intake port to pass between a plurality of fins;
a branch wall disposed downstream in a flow of the air across the plurality of fins of the heat sink in a manner of being orthogonal to a longitudinal direction of the fins, and configured to branch a flow of air passing between the fins into two directions, one of which has a branch angle of 45° or less with respect to an exhaust direction of air passing between the fins;
a plurality of ribs each being a plate-like member directed toward the fins in a manner of being parallel to the fins at a side of the branch wall where a branch angle exceeds 45°, and comprising an apex portion at a tip end thereof, the rib being configured to branch, at the tip end, a flow of air passing between the fins into two directions, a base of the ribs being connected to the branch wall; and
an exhaust port configured to exhaust air branched by the rib and the branch wall.

16. The personal computer according to claim 15, wherein both an upper edge portion and a lower edge portion of the rib are formed to have an angle of 30° or less from the apex portion to the base with respect to a direction of flow of air passing between the fins of the heat sink.

17. The personal computer according to claim 16, wherein a tangent of each rib and a tangent of the branch wall, at a connection point between the base of the rib and the branch wall, coincide with each other in a side view of the rib.

18. The personal computer according to claim 17, wherein an interval between the upper edge portion and the lower edge portion of the rib increases toward the base of the rib, and both the upper edge portion and the lower edge portion are formed in a straight line, a curved line, or a combination thereof in a side view of the rib.

19. The personal computer according to claim 15, wherein the plurality of fins are adjacent to each other at a predetermined interval.

20. The personal computer according to claim 15, further comprising at least one of a motherboard, a memory, a solid state drive, a riser card, and an input and output board.

* * * * *